(12) United States Patent  (10) Patent No.: US 7,777,340 B2
Nakao et al.  (45) Date of Patent: Aug. 17, 2010

(54) SEMICONDUCTOR DEVICE

(75) Inventors: Yuichi Nakao, Kyoto (JP); Satoshi Kageyama, Kyoto (JP); Masaru Naitou, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 165 days.

(21) Appl. No.: 11/979,728

(22) Filed: Nov. 7, 2007

(65) Prior Publication Data

US 2008/0237870 A1    Oct. 2, 2008

(30) Foreign Application Priority Data

Nov. 8, 2006  (JP) ............................. 2006-302982
Nov. 13, 2006 (JP) ............................. 2006-306998

(51) Int. Cl.
    *H01L 29/72* (2006.01)
(52) U.S. Cl. ...................... 257/758; 257/760; 257/762; 257/773
(58) Field of Classification Search .................. 257/758, 257/760, 762, 773
    See application file for complete search history.

(56) References Cited

U.S. PATENT DOCUMENTS

2003/0116852 A1* 6/2003 Watanabe et al. ........... 257/758
2004/0084777 A1   5/2004 Yamanoue et al.
2005/0054188 A1   3/2005 Matsuura et al.

FOREIGN PATENT DOCUMENTS

| JP | 2004-153015 | 5/2004 |
| JP | 2005-079207 | 3/2005 |
| JP | 2005-085939 | 3/2005 |
| JP | 2005-183779 | 7/2005 |

* cited by examiner

*Primary Examiner*—Edward Wojciechowicz
(74) *Attorney, Agent, or Firm*—Rabin & Berdo, PC

(57) ABSTRACT

The semiconductor device according to the present invention includes a semiconductor substrate, a first insulating layer laminated on the semiconductor substrate, a first metal wiring pattern embedded in a wire-forming region of the first insulating layer, a second insulating layer laminated on the first insulating layer, a second metal wiring pattern embedded in a wire-forming region of the second insulating layer and first dummy metal patterns embedded each in a wire-opposed region opposing to the wire-forming region of the second insulating layer and in a non-wire-opposed region opposing to a non-wire-forming region other than the wire-forming region of the second insulating layer, the wire-opposed region and the non-wire-opposed region each in a non-wire-forming region other than the wire-forming region of the first insulating layer.

4 Claims, 6 Drawing Sheets

SEMICONDUCTOR DEVICE

BACKGROUND OF THE INVENTION

1. Field of the Invention

The present invention relates to a semiconductor device, and more specifically, it relates to a semiconductor device having damascene wires.

2. Description of Related Art

With the recent integration of a semiconductor device, refinement of wires is required. In order to satisfy this requirement, employment of copper (Cu) wires or the like having small electrical resistance in place of conventional aluminum (Al) wires or the like is studied.

The damascene process is known as a method of forming fine copper wires.

In the damascene process, a first insulating layer is first laminated on a semiconductor substrate. Then, a first wiring trench is formed in a prescribed wire-forming region of the first insulating layer. Then, a copper film filling up the first wiring trench is formed on the first insulating layer. Then, the copper film is polished by chemical mechanical polishing (CMP) for removing excess copper not embedded in the first wiring trench, thereby forming a first copper wire embedded in the first wiring trench. Thereafter a second insulating is laminated on the first insulating layer, and a via hole reaching the first copper wire is formed in the second insulating layer. Further, a third insulating layer is laminated on the second insulating layer formed with the via hole. Then, a second wiring trench communicating with the via hole is formed in a prescribed wire-forming region of the third insulating layer. A copper film is formed on the third insulating layer, embedded in the second wiring trench and polished by CMP, thereby forming a second copper wire electrically connected with the first copper wire through the via hole.

In the polishing by CMP (herein after simply referred to as "CMP treatment"), however, the polishing rates for the copper films and the insulating layers are different from each other. When the insulating layers are dispersed in wiring density, therefore, the surfaces of the copper wires and the insulating layers are partially not planarized, but easily indented by the so-called dishing. Particularly when a multilevel interconnection structure is formed by laminating a plurality of insulating layers, such dishing is caused in the respective insulating layers, leading to remarkable indentations on the surfaces of copper wires and the insulating layers in upper layers. This may result in various inconveniences such as dispersion in wiring resistance, defective resolution in photolithography and a short circuit between the respective wires. Such inconveniences cause reduction of the yield in the manufacturing steps and reduction of the reliability in quality of the semiconductor device.

Therefore, a technique has been proposed to embed dummy wires not electrically connected with the copper wires in the respective insulating layers on non-wire-forming regions other than the wire-forming regions formed with the copper wires (refer to Japanese Unexamined Patent Publication No. 2004-153015, for example). Thus, apparent wiring density in the respective insulating layers can be made uniform, and dishing can be suppressed in the CMP treatment.

In the structure according to the above-mentioned proposal, however, the non-wire-forming regions of the respective layers are set to completely coincide with one another in plan view. Even if any of the wire-forming regions includes a portion provided with no wire, no dummy wire is formed on this portion. Therefore, a layer still dispersed in wiring density may remain to be dished out by the CMP treatment.

In general, a bonding pad made of a metal is laminated on the surface of a semiconductor device for electrically connecting the semiconductor device with an external device. A plurality of wiring layers having wiring patterns are laminated under the bonding pad. The wiring patterns of the respective wiring layers are electrically connected with one another through connecting vias. The wiring pattern of the uppermost wiring layer is electrically connected with the bonding pad through the corresponding connecting via. The wiring pattern of the uppermost wiring layer is further electrically connected with an element built on a semiconductor substrate for the semiconductor device. The bonding pad and a lead electrode (external electrode) of a lead frame are connected with each other by a bonding wire formed by a gold thin wire, thereby attaining electrical connection between the semiconductor device (element built on the semiconductor substrate) and the lead frame.

According to another method employing the damascene process, a first via hole reaching a semiconductor substrate is first formed in a first insulating layer made of silicon oxide ($SiO_2$) formed on the semiconductor substrate. Then, a first wiring trench is formed in the first insulating layer formed with the first via hole. Thereafter, a copper film is formed on the first insulating layer to fill up the first via hole and the first wiring trench. Then, the copper film is polished by chemical mechanical polishing (CMP) for removing excess copper not embedded in the first wiring trench, thereby forming a first copper wire embedded in the first wiring trench.

Then, a second insulating layer is formed on the first insulating layer, and a second via hole reaching the first copper wire is formed in the second insulating layer. A second wiring trench corresponding to the pattern of a bonding pad is formed in the second insulating layer formed with the second via hole, and copper is embedded in the second via hole and the second wiring trench, thereby forming a second copper wire electrically connected with the first copper wire.

Further, a third insulating layer is formed on the second insulating layer, and a third via hole reaching the second copper wire is formed in the third insulating layer. A pad trench for embedding the bonding pad is formed in the third insulating layer, and copper is embedded in the third via hole and the pad trench by a method similar to that in the cases of the first and second copper wires, thereby forming the bonding pad electrically connected with the second copper wire.

However, the bonding pad is generally in the form of a rectangle (100 μm square, for example) having a relatively large area. If each pattern of the copper wires includes a pattern of the same shape opposite to the bonding pad, therefore, this pattern also has a relatively large area, similarly to the bonding pad. When copper films not embedded in the respective wiring trenches are polished by the CMP treatment, therefore, the surfaces of the copper wires are not planarized but easily indented by dishing. Particularly when a multilevel interconnection structure is formed by laminating a plurality of wiring layers, such dishing is caused in each of the wiring layers, leading to a remarkable indentation in the upper layer. This may result in various inconveniences such as defective resolution in photolithography and a short circuit between the respective wiring layers.

SUMMARY OF THE INVENTION

An object of the present invention is to provide a semiconductor device capable of preventing dishing resulting from CMP treatment.

A semiconductor device according to one aspect of the present invention includes: a semiconductor substrate; a first insulating layer laminated on the semiconductor substrate; a first metal wiring pattern embedded in a wire-forming region of the first insulating layer; a second insulating layer laminated on the first insulating layer; a second metal wiring pattern embedded in a wire-forming region of the second insulating layer; and first dummy metal patterns embedded each in a wire-opposed region opposing to the wire-forming region of the second insulating layer and in a non-wire-opposed region opposing to a non-wire-forming region other than the wire-forming region of the second insulating layer, the wire-opposed region and the non-wire-opposed region each in a non-wire-forming region other than the wire-forming region of the first insulating layer.

According to this structure, the first metal wiring pattern is embedded in the wire-forming region of the first insulating layer laminated on the semiconductor substrate. The second metal wiring pattern is embedded in the wire-forming region of the second insulating layer laminated on the first insulating layer. The first dummy metal patterns embedded each in a wire-opposed region opposing to the wire-forming region of the second insulating layer and in a non-wire-opposed region opposing to a non-wire-forming region other than the wire-forming region of the second insulating layer, wherein the wire-opposed region and the non-wire-opposed region each are in a non-wire-forming region other than the wire-forming region of the first insulating layer.

In other words, in the first insulating layer, the first dummy metal patterns are formed not only in the non-wire-opposed region opposed to the non-wire-forming region of the second insulating layer but also in the wire-opposed region opposed to the wire-forming region of the second insulating layer. Thus, patterns constituted of the first metal wiring pattern and the first dummy metal patterns are uniformly arranged on the entire first insulating layer, whereby dispersion in pattern density (wiring density) can be reduced in the first insulating layer.

In CMP treatment for embedding the first metal wiring pattern and the first dummy metal patterns in the first insulating layer, therefore, dishing can be suppressed. Consequently, inconveniences such as dispersion in wiring resistance, defective resolution in photolithography and a short circuit between respective wiring layers can be suppressed.

Preferably, the semiconductor device further includes a second dummy metal pattern embedded in the non-wire-forming region of the second insulating layer, and a via connecting the first dummy metal pattern embedded in the non-wire-opposed region of the first insulating layer and the second dummy metal pattern with each other.

According to this structure, the second dummy metal pattern embedded in the non-wire-forming region of the second insulating layer and the first dummy metal pattern embedded in the non-wire-opposed region of the first insulating layer are connected with each other through the via.

With application of damascene wires to a semiconductor device, capacity (parasitic capacity) may be formed between wires of respective layers. Therefore, a technique has been studied to form first and second insulating layers using a low dielectric constant material (having a dielectric constant k of not more than 3.5, for example) in place of conventionally used silicon oxide ($SiO_2$). However, low dielectric constant films are so inferior in mechanical strength to silicon oxide films that the first and second insulating layers may be stripped from each other or the respective insulating layers may be cracked due to stress applied to the interface between the first and second layers or the interiors of the respective insulating layers in the CMP treatment.

According to the structure connecting the first and second dummy metal patterns with each other through the via, the via functions as a metal post passing through the second insulating layer, whereby the second insulating layer can be prevented from remarkable cracking, and the adhesiveness between the first and second insulating layers can be improved. Consequently, even if low dielectric constant films are used for the insulating layers, it is possible to prevent stripping and cracking of the insulating layers.

Preferably in the semiconductor device, the first dummy metal patterns and the second dummy metal pattern are each arranged in a staggered manner.

According to this structure, the first and second dummy metal patterns are each arranged in a staggered manner. In other words, the dummy metal patterns and the insulating layers are alternately adjacently arranged on the surfaces of the non-wire-forming regions of the respective insulating layers. Even if the surface of any of the insulating layers is cracked, therefore, the dummy metal pattern adjacent thereto can stop this cracking, whereby the insulating layer can be prevented from remarkable (long) cracks.

A semiconductor device according to another aspect of the present invention includes: a semiconductor substrate; a wiring layer laminated on the semiconductor substrate; a surface insulating layer laminated on the wiring layer; and a bonding pad embedded in a surface of the surface insulating layer and connected with a bonding wire for external electrical connection, wherein the wiring layer includes: an insulating layer; a residual insulating layer portion formed by partially leaving the insulating layer in a wiring trench formed by digging down the insulating layer; and a metal wiring pattern formed by embedding a metallic material in the wiring trench and electrically connected with the bonding pad.

According to this structure, the wiring layer formed under the surface insulating layer formed with the bonding pad includes the insulating layer, the residual insulating layer portion formed by partially leaving the insulating layer in the wiring trench formed by digging down the insulating layer and the metal wiring pattern formed by embedding the metallic material in the wiring trench and electrically connected with the bonding pad.

Thus, the residual insulating layer portion is formed in the wiring trench of the insulating layer, whereby the width of the metal wiring pattern formed by embedding the metallic material in the wiring trench can be relatively reduced. Therefore, the surface area of the metal wiring pattern can be reduced as compared with a metal wiring pattern formed by filling up the wiring trench with copper without providing the residual insulating layer portion in the wiring trench. When the metallic material is deposited on the insulating layer formed with the wiring trench and the residual insulating layer portion, and a part of the metallic material overflowing the wiring trench is polished by the CMP treatment, therefore, the metal wire can be prevented from dishing. Consequently, defective resolution in photolithography and a short circuit between the respective wiring layers can be suppressed, and a semiconductor device having high reliability in quality can be obtained.

Preferably, the wiring layer includes at least first and second wiring layers. In this case, the semiconductor device preferably further includes a bonding pad connecting via formed through the surface insulating layer for connecting the metal wire of the first wiring layer and the bonding pad with each other, and a metal wire connecting via formed through the insulating layer of the first wiring layer for connecting the metal wire of the first wiring layer and the metal wire of the second wiring layer with each other. The bonding pad connecting via and the metal wire connecting via are so formed that the bonding pad, the first wiring layer and the second wiring layer can be electrically connected with one another.

Preferably, the bonding pad connecting via and the metal wire connecting via are so formed that positions in a direction parallel to a surface of the semiconductor substrate deviate from each other. Thus, the bonding pad connecting via and the metal wire connecting via connecting the continuous and individual layers with one another are not aligned with each other, but the positions thereof deviate from each other in the vertical direction, whereby stress applied to the bonding pad in connection with the bonding wire, formation of a bump or probing for a device test can be dispersed and relaxed. Consequently, the insulating layers can be prevented from cracking.

The above and other objects, features and effects of the present invention will become more apparent from the following detailed description of the present invention with reference to accompanying drawings.

DETAILED DESCRIPTION OF PREFERRED EMBODIMENTS

Figure 1:
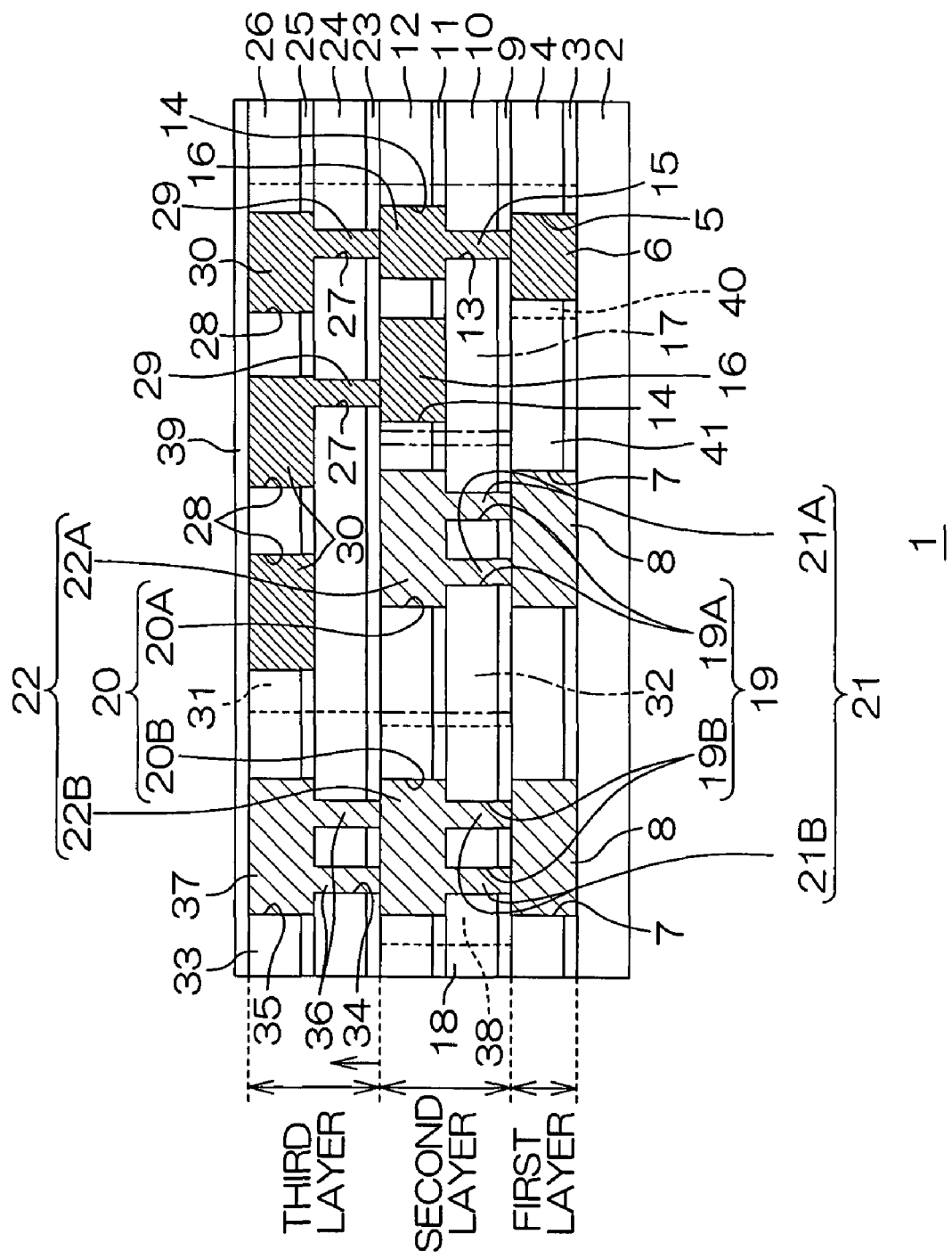
FIG. 1 is a schematic sectional view showing the structure of a semiconductor device according to a first embodiment of the present invention.

FIG. 1 is a schematic sectional view showing the structure of a semiconductor device according to a first embodiment of the present invention.

The semiconductor device 1 has a multilevel interconnection structure including a semiconductor substrate 2 and first, second and third layers formed by laminating these layers on the semiconductor substrate 2 in this order.

The semiconductor substrate 2 is made of a semiconductor material such as silicon (Si), for example, and a semiconductor element and the like are formed on the surface layer thereof.

The first layer is formed on the semiconductor substrate 2. More specifically, a diffusion preventing layer 3 and an interlayer film 4 are laminated on the semiconductor substrate 2 in this order, thereby forming the first layer.

The diffusion preventing film 3 is formed of silicon carbide (SiC), for example.

The interlayer film 4 is formed using an insulating material having a relatively low dielectric constant. For example, SiOC (dielectric constant: k=2.3 to 3.3) or SiOF (dielectric constant: k=3.3 to 3.8), for example, is employed as such an insulating material.

The interlayer film 4 and the diffusion preventing film 3 are provided with a wiring plug trench 5 reaching a semiconductor element region (not shown) of the semiconductor substrate 2 through these films 4 and 3.

A metallic material (copper, for example) is embedded in the wiring plug trench 5, thereby forming a wiring plug 6. The region of the first layer formed with the wiring plug 6 is referred to as a wiring plug forming region 40.

In a non-wiring plug forming region 41 of the interlayer film 4 and the diffusion preventing film 3 other than the wiring plug forming region 40, a plurality of first dummy wiring trenches 7 (two in FIG. 1) reaching the semiconductor substrate 2 through these films 4 and 3 are formed at a prescribed interval.

A metallic material (copper, for example) is embedded in the first dummy wiring trenches 7, thereby forming first dummy wires 8.

The second layer (first insulating layer) is formed on the interlayer film 4. More specifically, a diffusion preventing film 9, an interlayer film 10, a diffusion preventing film 11 and an interlayer film 12 are laminated on the interlayer film 4 in this order, thereby forming the second layer.

The diffusion preventing films 9 and 11 are formed using a material similar to that of the diffusion preventing film 3. The interlayer films 10 and 12 are formed using a material similar to that of the interlayer film 4.

In the interlayer film 12 and the diffusion preventing film 11, a plurality of first wiring trenches 14 (two in FIG. 1) having a prescribed wiring pattern are formed through these films 12 and 11 at a prescribed interval.

In the interlayer film 10 and the diffusion preventing film 9, a plurality of first interwire via holes 13 communicating the first wiring trenches 14 and the wiring plug 6 with each other are formed through these films 10 and 9. FIG. 1 shows only one of the plurality of first interwire via holes 13.

A metallic material (copper, for example) is embedded in the first interwire via holes 13, thereby forming first interwire vias 15. A metallic material (copper, for example) is embedded in the first wiring trenches 14, thereby forming first wires 16. Thus, the first wires 16 are electrically connected with the wiring plug 6 through the first interwire vias 15.

In the second layer, the region formed with the first wires 16 and the first interwire vias 15 is referred to as a first wire-forming region 17 (wire-forming region of the first insulating layer).

In a non-first wire-forming region 18 of the interlayer film 12 and the diffusion preventing film 11 other than the first wire-forming region 17, a plurality of second dummy wiring trenches 20 (two in FIG. 1) are formed through these films 12 and 11 on positions opposed to the first dummy wires 8 through the interlayer film 10 and the diffusion preventing film 9 at a prescribed interval. Referring to FIG. 1, one of the second dummy wiring trenches 20 (closer to the first wire-forming region 17) is referred to as a second dummy wiring trench 20A, and the other second dummy wiring trench 20 is referred to as a second dummy wiring trench 20B.

In the interlayer film 10 and the diffusion preventing film 9, a plurality of first dummy via holes 19 communicating the second dummy wiring trenches 20 and the first dummy wires 8 with one another are formed at a prescribed interval. Referring to FIG. 1, the first dummy via hole 19 linked to the second dummy wiring trench 20A is referred to as a first dummy via hole 19A, and the first dummy via hole 19 linked to the second dummy wiring trench 20B is referred to as a first dummy via hole 19B.

A metallic material (copper, for example) is embedded in the first dummy via holes 19, thereby forming first dummy vias 21. A metallic material (copper, for example) is embedded in the second dummy wiring trenches 20, thereby forming second dummy wires 22 (first dummy metal patterns). The first dummy vias 21 are so formed that the first dummy wires 8 and the second dummy wires 22 are connected with one another.

The third layer (second insulating layer) is formed on the interlayer film 12. More specifically, a diffusion preventing film 23, an interlayer film 24, a diffusion preventing film 25 and an interlayer film 26 are laminated on the interlayer film 12 in this order, thereby forming the third layer.

The diffusion preventing films 23 and 25 are formed using a material similar to that of the diffusion preventing film 3. The interlayer films 24 and 26 are formed using a material similar to that of the interlayer film 4.

In the interlayer film 26 and the diffusion preventing film 25, a plurality of second wiring trenches 28 (three in FIG. 1) having prescribed wiring patterns are formed through these films 26 and 25 at a prescribed interval.

In the interlayer film 24 and the diffusion preventing film 23, a plurality of second interwire via holes 27 communicating the second wiring trenches 28 and the first wires 16 with one another are formed through these films 24 and 23 at a prescribed interval. FIG. 1 shows only two of the plurality of second interwire via holes 27.

A metallic material (copper, for example) is embedded in the second interwire via holes 27, thereby forming second interwire vias 29. Further, a metallic material (copper, for example) is embedded in the second interwire trenches 28, thereby forming second wires 30 (second metal wiring patterns) Thus, the second wires 30 are electrically connected with the first wires 16 through the second interwire vias 29.

In the third layer, the region formed with the second wires 30 and the second interwire vias 29 is referred to as a second wire-forming region 31 (wire-forming region of the second insulating layer). In the second layer, a region formed with a second dummy wire 22A is referred to as a first wire-opposed region 32 since this region is opposed to the second wire-forming region 31. On the other hand, a region formed with second dummy wire 22B is referred to as a first non-wire-opposed region 38 since this region is opposed to a non-second wire-forming region 33 outside the second wire-forming region 31.

On the non-second wire-forming region 33 of the interlayer film 26 and the diffusion preventing film 25, a third dummy wiring trench 35 is formed through these films 26 and 25 on a position opposed to the second dummy wire 22B through the interlayer film 24 and the diffusion preventing film 23.

In the interlayer film 24 and the diffusion preventing film 23, a plurality of second dummy via holes 34 communicating the third dummy wiring trench 35 and the second dummy wire 22B with each other are formed at a prescribed interval.

A metallic material (copper, for example) is embedded in the second dummy via holes 34, thereby forming second dummy vias 36. A metallic material (copper, for example) is embedded in the third dummy wiring trench 35, thereby forming a third dummy wire 37 (second dummy metal pattern). The second dummy vias 36 are so formed that the second dummy wire 22 and the third dummy wire 37 are connected with each other.

An insulating film 39 for preventing the second wires 30 and the third dummy wire 37 from oxidation is formed on the interlayer film 26 so as to cover these wires 30 and 37.

Figure 2:
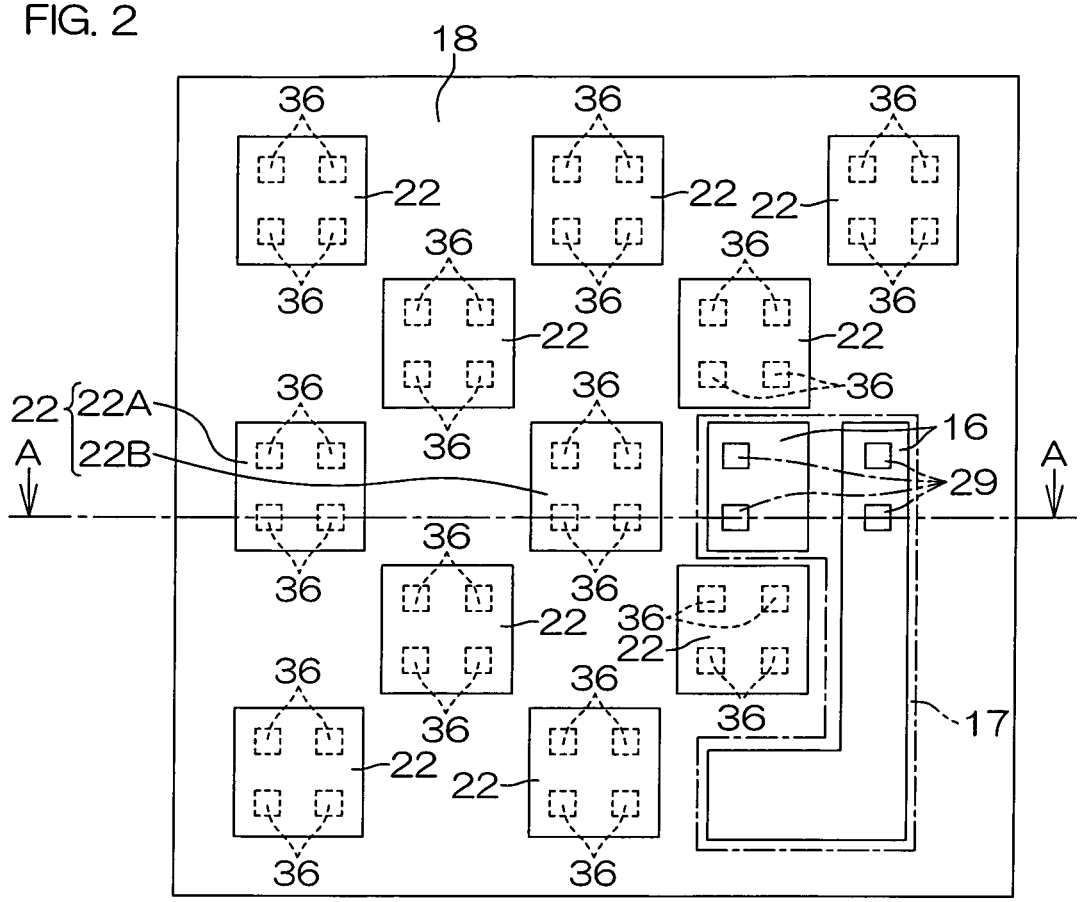
FIG. 2 is a schematic plan view of a second layer shown in FIG. 1, as seen from the top.

FIG. 2 is a schematic plan view of the second layer of the semiconductor device 1 shown in FIG. 1, as seen from the top. FIG. 1 corresponds to a sectional view taken along the line A-A in FIG. 2.

As shown in FIG. 2, the plurality of generally rectangular second dummy wires 22 (11 in FIG. 2) are arranged on the non-first wire-forming region 18 outside the first wire-forming region 17 formed with the first wires 16 at a prescribed interval so as to line up with one another along the respective sides of the semiconductor device 1. The plurality of second dummy wires 22 are arranged in a staggered manner as a whole, so that the dummy wires 22 of each line are not adjacent to those of the adjacent line. Due to this arrangement of the second dummy wires 22, the surfaces of the second dummy wires 22 and the interlayer film 12 alternately adjacently appear on the non-first wire-forming region 18 along the respective sides of the semiconductor device 1.

Preferably, the second dummy wires 22 are so formed that the surface areas thereof are not less than 30% with respect to the surface area of the second layer. When the surface areas of the second dummy wires 22 with respect to that of the second layer are within this range, dishing can be effectively suppressed in the steps of manufacturing the semiconductor device 1.

As shown by broken lines in FIG. 2, a plurality of second dummy vias 36 (four in a set in FIG. 2) are connected to the upper surface of each second dummy wire 22 (see FIG. 1). The second dummy vias 36 are arranged on the respective corners of each second dummy wire 22 in the form of a 2 by 2 matrix in plan view as a whole.

As well as on the non-wiring plug forming region 41 of the first layer of the semiconductor device 1, the first dummy wires 8 are arranged in a staggered manner as a whole similarly to the second dummy wires 22, though not shown in FIG. 2. Still further, as well as on the non-second wire-forming region 33 of the third layer, the third metal wires 37 are arranged in a staggered manner as a whole, similarly to the second dummy wires 22.

A method of manufacturing the semiconductor device 1 is now described.

In order to manufacture the semiconductor device 1, the diffusion preventing layer 3 and the interlayer film 4 are first laminated on the semiconductor substrate 2 in this order. Then, a photoresist (not shown) patterned correspondingly to the wiring plug trench 5 and the first dummy wiring trenches 7 is formed on the interlayer film 4. This photoresist is employed as a mask for etching the interlayer film 4 and the diffusion preventing film 3, thereby forming the wiring plug trench 5 and the first dummy wiring trenches 7 passing through the interlayer film 4 and the diffusion preventing film 3.

Then, the photoresist is removed, and a barrier film (not shown) is thereafter deposited by sputtering to cover the upper surface of the semiconductor substrate 2 and the inner surfaces of the wiring plug trench 5 and the first dummy wiring trenches 7. After this formation of the barrier film, a metal film (copper film, for example), not shown, is formed by electrolytic plating, sputtering or CVD, for example, to fill up the wiring plug trench 5 and the first dummy wiring trenches 7.

Then, the metal film is polished by CMP. This polishing is continued until the surface of the metal film is flush with that of the interlayer film 4, for removing excess parts of the metal film not embedded in the wiring plug trench 5 and the first dummy wiring trenches 7. At this time, the interlayer film 4 and the wiring plug 6 can be prevented from partial dishing, due to the first dummy wiring trenches 7 formed in the interlayer film 4. The wiring plug 6 embedded in the wiring plug trench 5 and connected to the semiconductor element region (not shown) of the semiconductor substrate 2, and the first dummy wires 8 embedded in the first dummy wiring trenches 7 are formed by this polishing, for completing formation of the first layer.

Thereafter, the diffusion preventing film 9, the interlayer film 10, the diffusion preventing film 11 and the interlayer film 12 are laminated on the interlayer film 4 in this order. Then, a photoresist (not shown) patterned correspondingly to the first interwire via holes 13 and the first dummy via holes 19 is formed. This photoresist is employed as a mask for etching the interlayer film 12, the diffusion preventing film 11, the interlayer film 10 and the diffusion preventing film 9, thereby forming the first interwire via holes 13 and the first dummy via holes 19.

Then, a photoresist (not shown) patterned correspondingly to the first interwire trenches 14 and the second dummy wiring trenches 20 is formed on the interlayer film 12. This photoresist is employed as a mask for etching the interlayer film 12 and the diffusion preventing film 11, thereby forming the first interwire trenches 14 and the second dummy wiring trenches 20.

Then, the photoresist is removed, and a barrier film (not shown) is deposited by sputtering to cover the upper surfaces of the wiring plug 6 and the first dummy wires 8 and the inner surfaces of the first interwire via holes 13, the first wiring trenches 14, the first dummy via holes 19 and the second dummy wiring trenches 20. After this formation of the barrier film, a metal film is formed by electrolytic plating, sputtering or CVD, for example, to fill up the first interwire via holes 13, the first wiring trenches 14, the first dummy via holes 19 and the second dummy wiring trenches 20.

Then, the metal film is polished by CMP. This polishing is continued until the surface of the metal film is flush with that of the interlayer film 12, for removing excess parts of the metal film not embedded in the first wiring trenches 14 and the second dummy wiring trenches 20. At this time, the interlayer film 12 and the first wires 16 can be prevented from partial dishing, due to the second dummy wiring trenches 20 formed in the interlayer film 12. The first wires 16 embedded in the first wiring trenches 14 and connected with the wiring plug 6 through the first interwire vias 15 and the second dummy wires 22 embedded in the second dummy wiring trenches 20 and connected with the first dummy wires 8 through the first dummy vias 21 are formed by this polishing, for completing formation of the second layer.

Thereafter, the diffusion preventing film 23, the interlayer film 24, the diffusion preventing film 25 and the interlayer film 26 are laminated on the interlayer film 12 in this order. Then, a photoresist (not shown) patterned correspondingly to the second interwire via holes 27 and the second dummy via holes 34 is formed. This photoresist is employed as a mask for etching the interlayer film 26, the diffusion preventing film 25, the interlayer film 24 and the diffusion preventing film 23, thereby forming the second interwire via holes 27 and the second dummy via holes 34.

Then, a photoresist (not shown) patterned correspondingly to the second wiring trenches 28 and the third dummy wiring trench 35 is formed on the interlayer film 26. This photoresist is employed as a mask for etching the interlayer film 26 and the diffusion preventing film 25, thereby forming the second wiring trenches 28 and the third dummy wiring trench 35.

Then, the photoresist is removed, and a barrier film (not shown) is deposited by sputtering to cover the upper surfaces of the first wires 16 and the second dummy wires 22 and the inner surfaces of the second interwire via holes 27, the second wiring trenches 28, the second dummy via holes 34 and the third dummy wiring trench 35. After this formation of the barrier film, a metal film is formed by electrolytic plating, sputtering or CVD, for example, to fill up the second interwire via holes 27, the second wiring trenches 28, the second dummy via holes 34 and the third dummy wiring trench 35.

Then, the metal film is polished by CMP. This polishing is continued until the surface of the metal film is flush with that of the interlayer film 26, for removing excess parts of the metal film not embedded in the second wiring trenches 28 and the third dummy wiring trench 35. At this time, the interlayer film 26 and the second wires 30 can be prevented from partial dishing, due to the third dummy wiring trench 35 formed in the interlayer film 26. The second wires 30 embedded in the second wiring trenches 28 and connected with the first wires 16 through the second interwire vias 29 and the third dummy wire 37 embedded in the third dummy wiring trench 35 and connected with the second dummy wires 22 through the second dummy vias 36 are formed by this polishing, for completing formation of the third layer.

The insulating film 39 is formed on the third layer, more specifically on the interlayer film 26, thereby completing the semiconductor device 1.

In the semiconductor device 1, as described above, the second dummy wires 22 are embedded in both of the first wire-opposed region 32 opposed to the second wire-forming region 31 and the first non-wire-opposed region 38 opposed to the non-second wire-forming region 33 of the third layer in the non-first wire-forming region 18 of the second layer, respectively.

In other words, the second dummy wires 22 are formed not only in the first non-wire-opposed region 38 opposed to the non-second wire-forming region 33 of the third layer, but also in the first wire-opposed region 32 opposed to the second wire-forming region 31 of the third layer in the second layer. Thus, patterns constituted of the first wires 16 and the second dummy wires 22 are uniformly arranged on the entire second layer, whereby dispersion in pattern density (wiring density) can be reduced in the second layer.

In the CMP steps for embedding the first wires 16 and the second dummy wires 22 in the second layer, therefore, dishing can be suppressed. Consequently, inconveniences such as dispersion in wiring resistance, defective resolution in photolithography and a short circuit between the respective wiring layers can be suppressed.

The third dummy wire 37 and the second dummy wires 22 embedded in the first non-wire-opposed region 38 are connected with each other by the second dummy vias 36.

With the application of damascene wires to the semiconductor device 1, capacity (parasitic capacity) may be formed between the wires of the respective layers. Therefore, a technique has been studied to form the respective interlayer films (12, 24 and 26) using a low dielectric constant material (having a dielectric constant k of not more than 3.5) in place of conventionally used silicon oxide ($SiO_2$). However, low dielectric constant films are so inferior in mechanical strength to silicon oxide films that the second and third layers may be separated from each other or the respective interlayer films (12, 24 and 26) may be cracked due to stress applied to the interface between the second and third layers or the interiors of the respective interlayer films (12, 24 and 26) in the CMP step.

The second dummy vias 36 are so provided between the second and third dummy wires 22 and 37 as to function as metal posts passing through the interlayer film 24, whereby the interlayer film 24 can be prevented from remarkable cracking and the adhesiveness between the second and third layers can be improved. The interlayer films 12 and 26 can also be prevented from remarkable cracking due to the second and third dummy wires 22 and 37 formed thereon, respectively. Consequently, the respective layers can be prevented from stripping and cracking even when low dielectric constant films are used for the interlayer films (12, 24 and 26). A similar effect can also be attained between the first and second layers due to the first dummy vias 21 provided between the first and second dummy wires 8 and 22.

Further, the plurality of second dummy vias 36 are arranged on the respective corners of the second dummy wires 22 in the form of 2 by 2 matrices as a whole in plan view. Even if large stress is applied to the third dummy wire 37, therefore, this stress can be uniformly dispersed to the second dummy vias 36.

In addition, the first, second and third dummy wires 8, 22 and 37 are each arranged in a staggered manner.

In other words, the respective dummy wires (8, 22 and 37) and the respective interlayer films (4, 12 and 26) are alternately adjacently arranged on the non-wiring plug forming region 41 of the first layer, the non-first wire-forming region 18 of the second layer and the non-second wire-forming region 33 of the third layer. Even if the surface of any of the respective interlayer films (4, 12 and 26) is cracked, therefore, the respective dummy wires (8, 22 or 37) adjacent thereto can stop this cracking, whereby the respective interlayer films (4, 12 and 26) can be prevented from remarkable (long) cracks.

While the first embodiment of the present invention has been described, the present invention can also be embodied in other modes.

While the second and third layers (see FIG. 1) correspond to the first and second insulating layers of the present invention, respectively, in the above-mentioned first embodiment, the first and second layers (see FIG. 1) may alternatively serve as the first and second insulating layers of the present invention, respectively. Further, a fourth layer may additionally be formed on the third layer, and the third and fourth layers may serve as the first and second insulating layers of the present invention, respectively.

While the respective interlayer films (4, 10, 12, 24 and 26) are formed using the low dielectric constant films made of SiOC (dielectric constant k=2.3 to 3.3) or SiOF (dielectric constant k=3.3 to 3.8) in the above-mentioned first embodiment, the interlayer films may alternatively be made of conventionally used silicon oxide ($SiO_2$).

While the respective wires (6, 14 and 30) and the respective dummy wires (8, 22 and 37) are formed by the so-called dual damascene process in the above-mentioned first embodiment, these wires may alternatively be formed by the so-called single damascene process.

Figure 3:
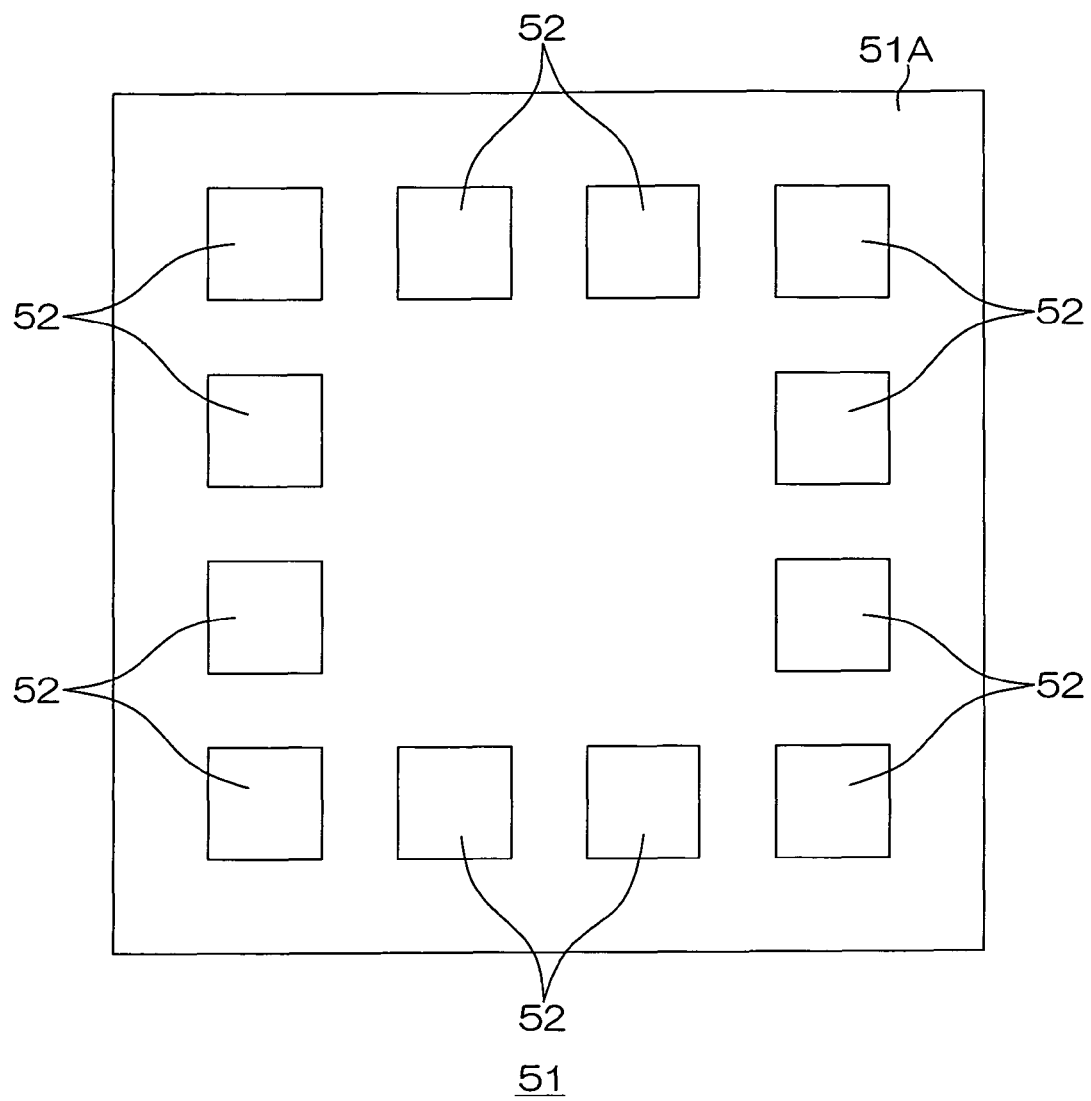
FIG. 3 is a schematic plan view showing the structure of a semiconductor device according to a second embodiment of the present invention.

FIG. 3 is a schematic plan view showing the structure of a semiconductor device according to a second embodiment of the present invention.

Referring to FIG. 3, the semiconductor device 51 is generally rectangularly formed in plan view, for example.

A plurality of bonding pads 52 (12 in this embodiment, for example) are arranged on the upper surface (surface) 51A of the semiconductor device 51 along the periphery of the upper surface 51A at intervals from one another. Each bonding pad 52 is made of a metallic material such as copper, aluminum or an aluminum-copper alloy, for example, and generally rectangularly formed in plan view.

Figure 4:
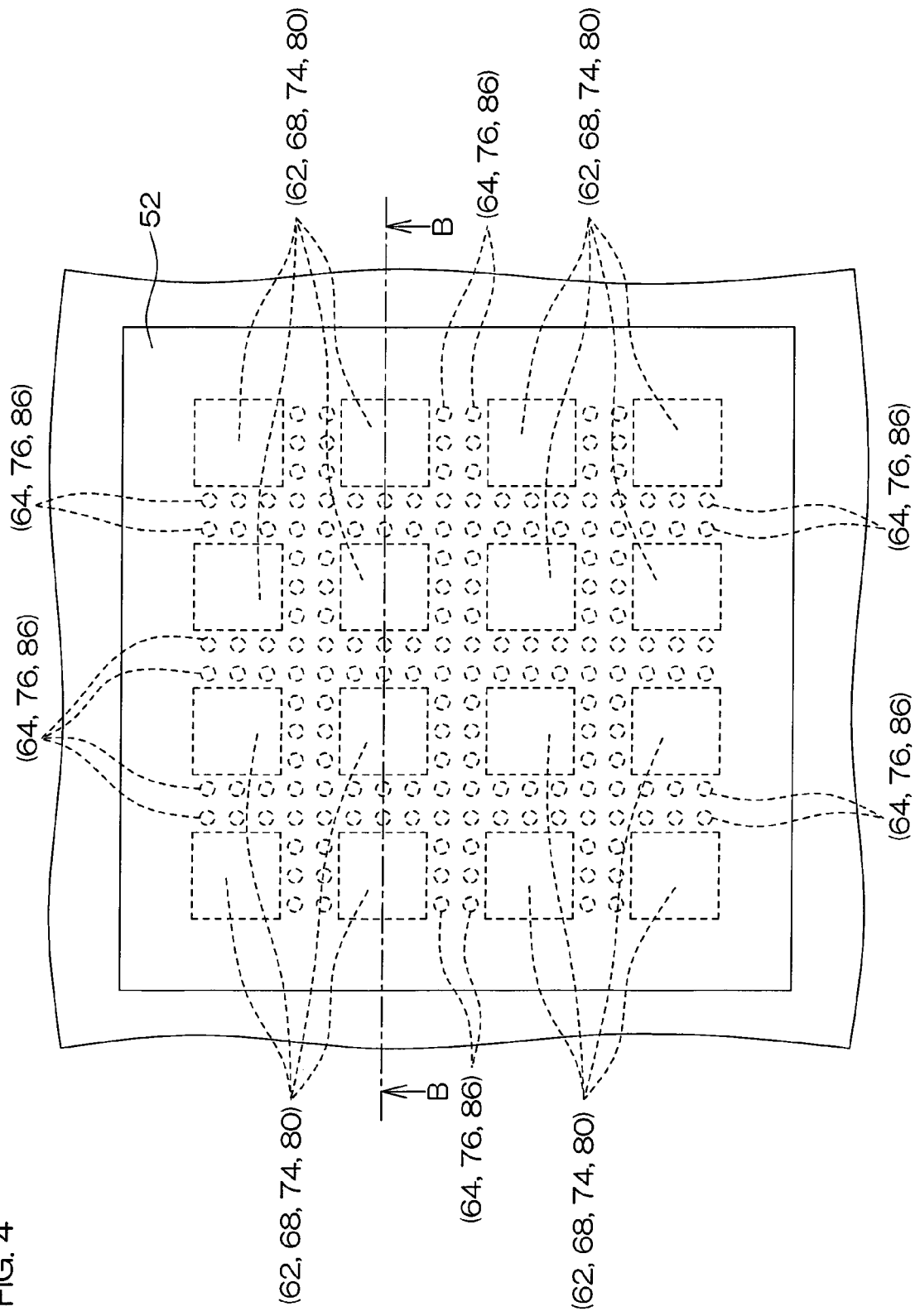
FIG. 4 is a plan view showing the circumference of each bonding pad shown in FIG. 3.
Figure 5:
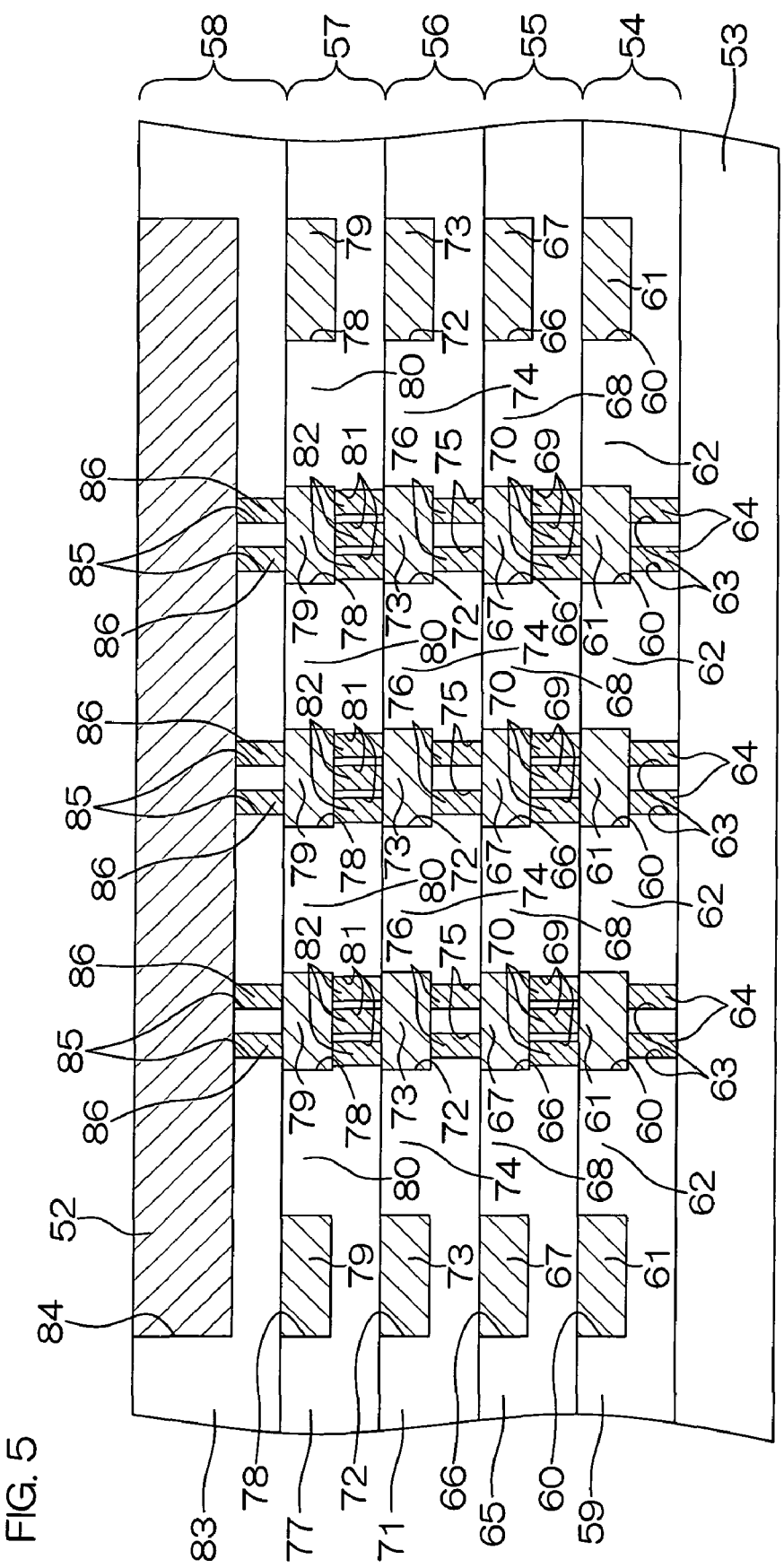
FIG. 5 is a sectional view taken along the line B-B in FIG. 4.

FIG. 4 is a plan view showing the circumference of each bonding pad 52 shown in FIG. 3. FIG. 5 is a sectional view taken along the line B-B in FIG. 4.

The semiconductor device 51 includes a semiconductor substrate 53 as well as a first wiring layer 54, a second wiring layer 55, a third wiring layer 56, a fourth wiring layer 57 and a pad layer 58 successively laminated on this semiconductor substrate 53.

The semiconductor substrate 53 is made of a semiconductor material such as silicon (Si), for example, and a functional element such as a semiconductor element is formed on the surface layer thereof.

The first wiring layer 54 is formed on the semiconductor substrate 53. The first wiring layer 54 includes an interlayer dielectric film 59 laminated on the semiconductor substrate 53. The interlayer dielectric film 59 is made of silicon oxide, for example.

Wiring trenches 60 generally rectangular in plan view are formed in the interlayer dielectric film 59 by digging down the interlayer dielectric film 59.

A plurality of residual dielectric film portions 62 (16 in this embodiment) are formed inside the wiring trenches 60 by partially leaving the interlayer dielectric film 59. The residual dielectric film portions 62 are generally rectangularly formed in plan view in a state protruding from the bottoms of the wiring trenches 60, and arranged in the form of a 4 by 4 matrix in plan view as a whole (see FIG. 4).

The residual dielectric film portions 62 each are so arranged in the form of the 4 by 4 matrix as a whole that the wiring trenches 60 are arranged perpendicularly to one another at a prescribed interval to form a lattice pattern (5 by 5 in this embodiment). A metallic material (copper, for example) is embedded in the wiring trenches 60, thereby forming metal wires 61. The residual dielectric film portions 62 are exposed from the metal wires 61.

Thus, the residual dielectric film portions 62 are so provided inside the wiring trenches 60 that the interval between the metal wires 61 can be reduced between the interlayer dielectric film 59 and the residual dielectric film portions 62 or between the residual dielectric film portions 62 and the residual dielectric film portions 62 in the row and column directions of the wiring trenches 60.

Among the wiring trenches 60 of the lattice pattern (5 by 5) in the interlayer dielectric film 59, the central 3 by 3 wiring trenches 60 are provided with a plurality of substrate connecting via holes 63 passing through the interlayer dielectric film 59 from the bottom surfaces of the wiring trenches 60 and reaching the semiconductor substrate 53. The substrate connecting via holes 63 are arranged in two lines on each row and each column along the row and column directions. The wiring trenches 60 and the substrate connecting via holes 63 communicate with one another. A metallic material (copper, for example) is embedded in the substrate connecting via holes 63, thereby forming substrate connecting vias 64 (see FIG. 4).

The metal wires 61 are electrically connected with the semiconductor substrate 53 through the substrate connecting vias 64. In other words, the first wiring layer 54 and the semiconductor substrate 53 are electrically connected with each other.

The second wiring layer 55 is formed on the first wiring layer 54. The second wiring layer 55 includes an interlayer dielectric film 65 laminated on the interlayer dielectric film 59. The interlayer dielectric film 65 is made of silicon oxide, for example.

Wiring trenches 66 generally rectangular in plan view are formed in the interlayer dielectric film 65 by digging down the interlayer dielectric film 65.

A plurality of residual dielectric film portions 68 (16 in this embodiment) are formed inside the wiring trenches 66 by partially leaving the interlayer dielectric film 65. The residual dielectric film portions 68 each are generally rectangularly formed in plan view in a state protruding from the bottoms of the wiring trenches 66, and arranged in the form of a 4 by 4 matrix in plan view as a whole (see FIG. 4).

The residual dielectric film portions 68 are so arranged in the form of the 4 by 4 matrix as a whole that the wiring trenches 66 are arranged perpendicularly to one another at a prescribed interval to form a lattice pattern (5 by 5 in this embodiment). A metallic material (copper, for example) is embedded in the wiring trenches 66, thereby forming metal wires 67. The residual dielectric film portions 68 are exposed from the metal wires 67.

Thus, the residual dielectric film portions 68 are so provided inside the wiring trenches 66 that the interval between the metal wires 67 can be reduced between the interlayer dielectric film 65 and the residual dielectric film portions 68 or between the residual dielectric film portions 68 and the residual dielectric film portions 68 in the row and column directions of the wiring trenches 66.

Among the wiring trenches 66 of the lattice pattern (5 by 5) in the interlayer dielectric film 65, the central 3 by 3 wiring trenches 66 are provided with a plurality of interwire connecting via holes 69 passing through the interlayer dielectric film 65 from the bottom surfaces of the wiring trenches 66 and reaching the metal wires 61. The interwire connecting via holes 69 are arranged in three lines on each row and each column along the row and column directions. Thus, the positions of the vertical central axes of the respective substrate connecting via holes 63 and the central axes of the respective interwire connecting via holes 69 deviate from one another in the direction parallel to the surface of the semiconductor substrate 53.

The wiring trenches 66 and the interwire connecting via holes 69 communicate with one another. A metallic material (copper, for example) is embedded in the interwire connecting via holes 69, thereby forming interwire connecting vias 70.

The metal wires 67 are electrically connected with the metal wires 61 through the interwire connecting vias 70. In other words, the second wiring layer 55 and the first wiring layer 54 are electrically connected with each other.

The third wiring layer 56 is formed on the second wiring layer 55. This third wiring layer 56 includes an interlayer dielectric film 71 laminated on the interlayer dielectric film 65. The interlayer dielectric film 71 is made of silicon oxide, for example.

Wiring trenches 72 generally rectangular in plan view are formed in the interlayer dielectric film 71 by digging down the interlayer dielectric film 71.

A plurality of residual dielectric film portions 74 (16 in this embodiment) are formed inside the wiring trenches 72 by partially leaving the interlayer dielectric film 71. The residual dielectric film portions 74 each are generally rectangularly formed in plan view in a state protruding from the bottoms of the wiring trenches 72, and arranged in the form of a 4 by 4 matrix in plan view as a whole (see FIG. 4).

The residual dielectric film portions 74 are so arranged in the form of the 4 by 4 matrix as a whole that the wiring trenches 72 are arranged perpendicularly to one another at a prescribed interval to form a lattice pattern (5 by 5 in this embodiment). A metallic material (copper, for example) is embedded in the wiring trenches 72, thereby forming metal wires 73. The residual dielectric film portions 74 are exposed from the metal wires 73.

Thus, the residual dielectric film portions 74 are so provided inside the wiring trenches 72 that the interval between the metal wires 73 can be reduced between the interlayer dielectric film 71 and the residual dielectric film portions 74 or between the residual dielectric film portions 74 and the residual dielectric film portions 74 in the row and column directions of the wiring trenches 72.

Among the wiring trenches 72 of the lattice pattern (5 by 5) in the interlayer dielectric film 71, the central 3 by 3 wiring trenches 72 are provided with a plurality of interwire connecting via holes 75 passing through the interlayer dielectric film 71 from the bottom surfaces of the wiring trenches 72 and reaching the metal wires 67. The interwire connecting via holes 75 are arranged in two lines on each row and each column along the row and column directions. Thus, the positions of the vertical central axes of the respective interwire connecting via holes 69 and the central axes of the respective interwire connecting via holes 75 deviate from one another in the direction parallel to the surface of the semiconductor substrate 53.

The wiring trenches 72 and the interwire connecting via holes 75 communicate with one another. A metallic material (copper, for example) is embedded in the interwire connecting via holes 75, thereby forming interwire connecting vias 76 (see FIG. 4).

The metal wires 73 are electrically connected with the metal wires 67 through the interwire connecting vias 76. In other words, the third wiring layer 56 and the second wiring layer 55 are electrically connected with each other.

The fourth wiring layer 57 is formed on the third wiring layer 56. This fourth wiring layer 57 includes an interlayer dielectric film 77 laminated on the interlayer dielectric film 71. The interlayer dielectric film 77 is made of silicon oxide, for example.

Wiring trenches 78 generally rectangular in plan view are formed in the interlayer dielectric film 77 by digging down the interlayer dielectric film 77.

A plurality of residual dielectric film portions 80 (16 in this embodiment) are formed inside the wiring trenches 78 by partially leaving the interlayer dielectric film 77. The residual dielectric film portions 80 each are generally rectangularly formed in plan view in a state protruding from the bottoms of the wiring trenches 78, and arranged in the form of a 4 by 4 matrix in plan view as a whole (see FIG. 4).

The residual dielectric film portions 80 are so arranged in the form of the 4 by 4 matrix as a whole that the wiring trenches 78 are arranged perpendicularly to one another at a prescribed interval to form a lattice pattern (5 by 5 in this embodiment). A metallic material (copper, for example) is embedded in the wiring trenches 78, thereby forming metal wires 79. The residual dielectric film portions 80 are exposed from the metal wires 79.

Thus, the residual dielectric film portions 80 are so provided inside the wiring trenches 78 that the interval between the metal wires 79 can be reduced between the interlayer dielectric film 77 and the residual dielectric film portions 80 or between the residual dielectric film portions 80 and the residual dielectric film portions 80 in the row and column directions of the wiring trenches 78.

Among the wiring trenches 78 of the lattice pattern (5 by 5) in the interlayer dielectric film 77, the central 3 by 3 wiring trenches 78 are provided with a plurality of interwire connecting via holes 81 passing through the interlayer dielectric film 77 from the bottom surfaces of the wiring trenches 78 and reaching the metal wires 73. The interwire connecting via holes 81 are arranged in three lines on each row and each column along the row and column directions. Thus, the positions of the vertical central axes of the respective substrate connecting via holes 75 and the central axes of the respective interwire connecting via holes 81 deviate from one another in the direction parallel to the surface of the semiconductor substrate 53.

The wiring trenches 78 and the interwire connecting via holes 81 communicate with one another. A metallic material (copper, for example) is embedded in the interwire connecting via holes 81, thereby forming interwire connecting vias 82.

The metal wires 79 are electrically connected with the metal wires 73 through the interwire connecting vias 82. In other words, the fourth wiring layer 57 and the third wiring layer 56 are electrically connected with each other.

The pad layer 58 is formed on the fourth wiring layer 57. This pad layer 58 includes a surface insulating film 83 laminated on the interlayer dielectric film 77. The surface insulating film 83 is made of silicon oxide, for example.

A pad trench 84 generally rectangular in plan view is formed in the surface insulating film 83 by digging down the surface insulating film 83. A metallic material (copper, aluminum or an aluminum-copper alloy, for example) is embedded in the pad trench 84, thereby forming a bonding pad 52.

The surface insulating film 83 is formed with a plurality of pad connecting via holes 85 passing through the surface insulating film 83 from the bottom surface of the pad trench 84 and reaching the metal wires 79. The pad connecting via holes 85 are arranged on the same central axes as the interwire connecting via holes 75 formed in the interlayer dielectric film 71. Thus, the positions of the vertical central axes of the respective substrate connecting via holes 81 and the central axes of the respective pad connecting via holes 85 deviate from one another in the direction parallel to the surface of the semiconductor substrate 53.

The pad trench 84 and the pad connecting via holes 85 communicate with one another. A metallic material (copper, aluminum or an aluminum-copper alloy, for example) is embedded in the pad connecting via holes 85, thereby forming pad connecting vias 86 (see FIG. 4).

The bonding pad 52 is electrically connected with the metal wires 79 through the pad connecting vias 86. In other words, the pad layer 58 and the fourth wiring layer 57 are electrically connected with each other.

The semiconductor device 51 is die-bonded to an island of a lead frame (not shown) for a semiconductor package, for example, and the bonding pad 52 is connected to a lead electrode (not shown) of the lead frame through a bonding wire (not shown) formed by a thin gold wire, for example, whereby electrical connection between the semiconductor device 51 and the external lead frame is attained.

Next, a method of manufacturing the semiconductor device 51 is now described.

In order to manufacture the semiconductor device 51, the first wiring layer 54 is first formed on the semiconductor substrate 53.

In this formation of the first wiring layer 54, the interlayer dielectric film 59 is first formed on the semiconductor substrate 53. Then, a photoresist (not shown) patterned correspondingly to the substrate connecting via holes 63 is formed on the interlayer dielectric film 59. This photoresist is employed as a mask for etching the interlayer dielectric film 59, thereby forming the substrate connecting via holes 63 passing through the interlayer dielectric film 59.

Then, the photoresist is removed by ashing, and photoresist patterned correspondingly to the wiring trenches 60 is formed on the interlayer dielectric film 59. This photoresist is employed as a mask for etching the interlayer dielectric film 59, thereby forming the wiring trenches 60 to expose the opening surfaces of the substrate connecting via holes 63 and leave the residual dielectric film portions 62.

Then, the photoresist is removed by ashing, and a barrier film (not shown) is deposited by sputtering to cover the upper surface of the semiconductor substrate 53, the side surfaces of the substrate connecting via holes 63 and the inner surfaces of the wiring trenches 60. After this formation of the barrier film, a metal film (copper film, for example), not shown, is formed on the interlayer dielectric film 59 by electrolytic plating, sputtering or CVD, for example, to fill up the substrate connecting via holes 63 and the wiring trenches 60.

Then, the metal film is polished by CMP. This polishing is continued until the surface of the metal film is flush with that of the interlayer dielectric film 59. Thus, excess parts of the metal film not embedded in the wiring trenches 60 are removed, and the metal wires 61 embedded in the wiring trenches 60 are obtained.

Then, the second wiring layer 55 is formed on the first wiring layer 54.

In this formation of the second wiring layer 55, the interlayer dielectric film 65 is first formed on the interlayer dielectric film 59. Then, a photoresist (not shown) patterned correspondingly to the interwire connecting via holes 69 is formed on the interlayer dielectric film 65. This photoresist is employed as a mask for etching the interlayer dielectric film 65, thereby forming the interwire connecting via holes 69 passing through the interlayer dielectric film 65.

Then, the photoresist is removed by ashing, and photoresist patterned correspondingly to the wiring trenches 66 is formed on the interlayer dielectric film 65. This photoresist is employed as a mask for etching the interlayer dielectric film 65, thereby forming the wiring trenches 66 to expose the opening surfaces of the interwire connecting via holes 69 and leave the residual dielectric film portions 68.

Then, the photoresist is removed by ashing, and a barrier film (not shown) is deposited by sputtering to cover the upper surface of the interlayer dielectric film 59, the side surfaces of the interwire connecting via holes 69 and the inner surfaces of the wiring trenches 66. After this formation of the barrier film, a metal film is formed on the interlayer dielectric film 65 by electrolytic plating, sputtering or CVD, for example, to fill up the interwire connecting via holes 69 and the wiring trenches 66.

Then, the metal film is polished by CMP. This polishing is continued until the surface of the metal film is flush with that of the interlayer dielectric film 65. Thus, excess parts of the metal film not embedded in the wiring trenches 66 are removed, and the metal wires 67 embedded in the wiring trenches 66 are obtained.

Thereafter, the third wiring layer 56 is formed on the second wiring layer 55 by a method similar to that for forming the first wiring layer 54. Then, the fourth wiring layer 57 is formed on the third wiring layer 56 by a method similar to that for forming the second wiring layer 55, thereby completing the multilevel interconnection structure formed by the respective wiring layers (54, 55, 56 and 57) laminated with one another.

After this formation of the fourth wiring layer 57, the pad layer 58 is formed on the fourth wiring layer 57.

In this formation of the pad layer 58, the surface insulating film 83 is first formed on the interlayer dielectric film 77. Then, a photoresist (not shown) patterned correspondingly to the pad connecting via holes 85 is formed on the surface insulating film 83. This photoresist is employed as a mask for etching the surface insulating film 83, thereby forming the pad connecting via holes 85 passing through the surface insulating film 83.

Then, the photoresist is removed by ashing, and photoresist patterned correspondingly to the pad trench 84 is formed on the surface insulating film 83. This photoresist is employed as a mask for etching the surface insulating film 83, thereby forming the pad trench 84 to expose the opening surfaces of the pad connecting via holes 85.

Then, the photoresist is removed by ashing, and a barrier film (not shown) is deposited by sputtering to cover the upper surface of the interlayer dielectric film 77, the side surfaces of the pad connecting via holes 85 and the inner surface of the pad trench 84. After this formation of the barrier film, a metal film (copper film, aluminum film or aluminum-copper alloy film, for example) is formed on the surface insulating film 83 by electrolytic plating, sputtering or CVD, for example, to fill up the pad connecting via holes 85 and the pad trench 84.

Then, the metal film is polished by CMP. This polishing is continued until the surface of the metal film is flush with that of the surface insulating film 83. Thus, excess parts of the metal film not embedded in the pad trench 84 are removed and the bonding pad 52 embedded in the pad trench 84 is formed, thereby completing the semiconductor device 51.

In the semiconductor device 51, as described above, the residual dielectric film portions 80 exposed from the metal wires 79 are formed in the fourth wiring layer 57 by partially leaving the interlayer dielectric film 77 in the wiring trenches 78. In the third wiring layer 56, the residual dielectric film portions 74 exposed from the metal wires 73 are formed by partially leaving the interlayer dielectric film 71 in the wiring trenches 72. In the second wiring layer 55, the residual dielectric film portions 68 exposed from the metal wires 67 are formed by partially leaving the interlayer dielectric film 65 in the wiring trenches 66. In the first wiring layer 54, further, the residual dielectric film portions 62 exposed from the metal wires 61 are formed by partially leaving the interlayer dielectric film 59 in the wiring trenches 60.

Thus, the residual dielectric film portions (62, 68, 74 and 80) exposed from the metal wires (61, 67, 73 and 79) are so formed inside the wiring trenches (60, 66, 72 and 78) of the wiring layers (54, 55, 56 and 57) that the interval between the metal wires (61, 67, 73 and 79) can be reduced between the interlayer dielectric films (59, 65, 71 and 77) and the residual dielectric film portions (62, 68, 74 and 80) or between the residual dielectric film portions (62, 68, 74 and 80) and the residual dielectric film portions (62, 68, 74 and 80), respectively.

Therefore, the surface areas of the metal wires (61, 67, 73 and 79) can be reduced as compared with metal wires formed by filling up the wiring trenches (60, 66, 72 and 78) with copper without providing the residual dielectric film portions (62, 68, 74 and 80) in the wiring trenches (60, 66, 72 and 78), respectively.

When the metallic materials are deposited on the interlayer dielectric films (59, 65, 72 and 77) formed with the wiring trenches (60, 66, 72 and 78) and the residual dielectric film portions (62, 68, 74 and 80) and parts of the metallic materials overflowing the wiring trenches (60, 66, 72 and 78) are polished by CMP, respectively, the metal wires (61, 67, 73 and 79) each can be prevented from dishing. Consequently, defective resolution in photolithography and a short circuit between the wiring layers can be suppressed, and a semiconductor device having high reliability in quality can be obtained.

The substrate connecting vias 64, the interwire connecting vias 70, the interwire connecting vias 76, the interwire connecting vias 82 and the pad connecting vias 86 are formed between the semiconductor substrate 53 and the first wiring layer 54, between the first and second wiring layers 54 and 55, between the second and third wiring layers 55 and 56, between the third and fourth wiring layers 56 and 57 and between the fourth wiring layer 57 and the pad layer 58, respectively, whereby the semiconductor substrate 53, the first to fourth wiring layers 54 to 57 and the bonding pad 52 can be electrically connected with one another through the connecting vias (64, 70, 76, 82 and 86).

The positions of the substrate connecting vias 64 and the interwire connecting vias 70 deviate from one another in the direction parallel to the surface of the semiconductor substrate 53. Further, the positions of the interwire connecting vias 70 and 76, the interwire connecting vias 76 and 82 and the interwire connecting vias 82 and the pad connecting vias 86 also deviate from one another in the direction parallel to the surface of the semiconductor substrate 53. Thus, the respective connecting vias (64, 70, 76, 82 and 86) connecting the continuous and individual layers with one another are not aligned with one another but the positions thereof deviate from one another in the vertical direction, whereby stress applied to the bonding pad 52 in connection with the bonding wire, formation of a bump or probing for a device test can be dispersed and relaxed. Consequently, the dielectric films (59, 65, 71, 77 and 83) each can be inhibited from cracking.

While the second embodiment of the present invention has been described, the present invention can also be embodied in other modes.

Figure 6:
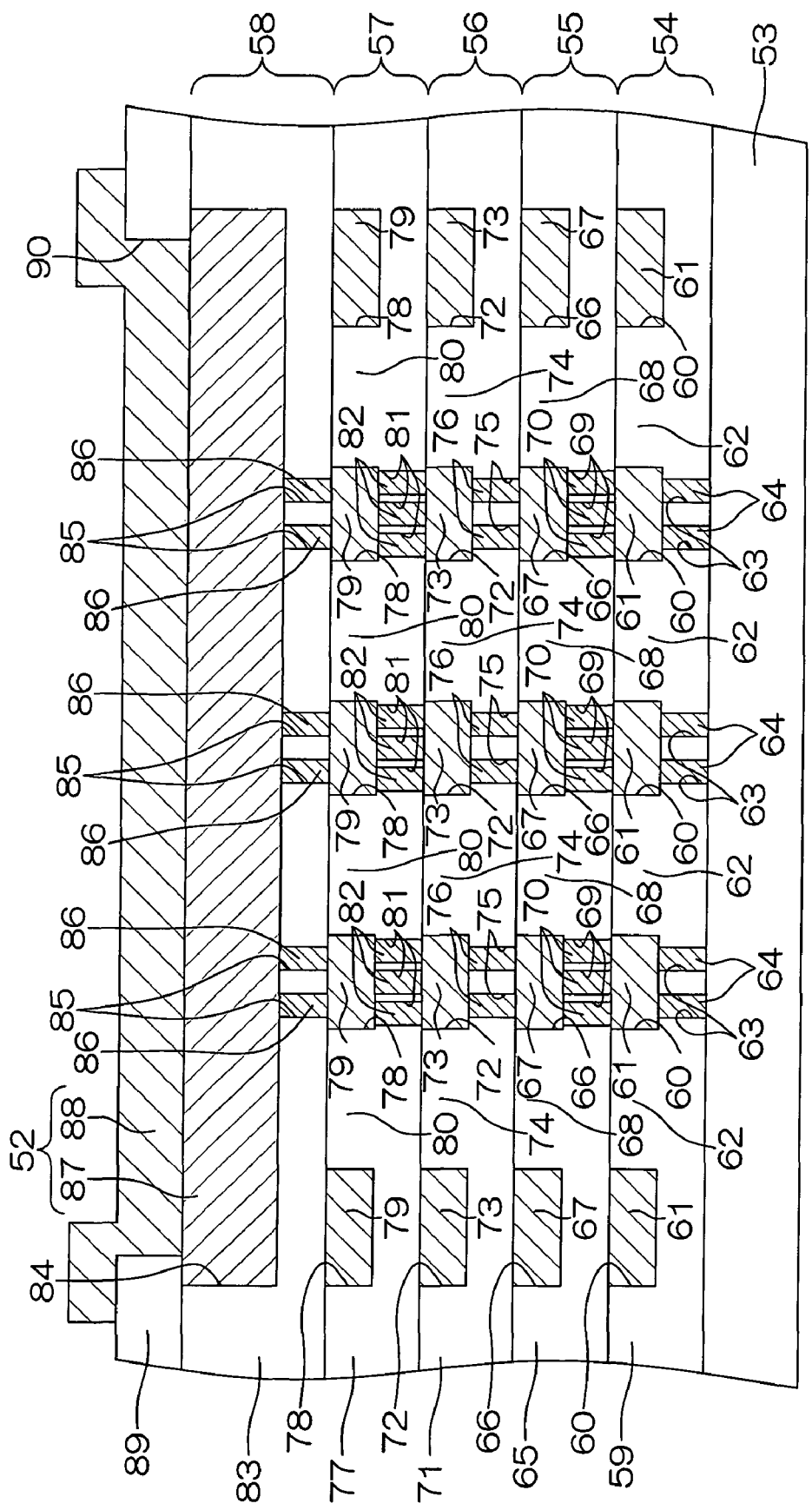
FIG. 6 is a schematic sectional view showing a modification of the semiconductor device shown in FIG. 3 in which a bonding pad is in another structure.

For example, the construction in which while the bonding pad 52 is made of a metallic material such as copper, aluminum or an aluminum-copper alloy, for example, is illustrated in the above-mentioned second embodiment, the bonding pad 52 may alternatively be constituted of an embedded portion 87 formed by filling up the pad trench 84 with copper and a surface portion 88 made of aluminum arranged on a pad opening 90 formed in an insulating film 89 laminated on the surface insulating film 83, as shown in FIG. 6.

In order to manufacture the semiconductor device 51 having this structure, the pad connecting via holes 85 and the pad trench 84 are filled up with copper in place of the metallic material (copper, aluminum or an aluminum-copper alloy, for example) in the steps of manufacturing the semiconductor device 51 according to the above-mentioned second embodiment. Thereafter, the copper filling up the pad connecting via holes 85 and the pad trench 84 is polished by CMP. This polishing is continued until the surface of the copper is flush with that of the surface insulating film 83. Thus, excess parts of the copper not embedded in the pad trench 84 are removed, and the embedded portion 87 embedded in the pad trench 84 is formed.

Thereafter, the insulating film 89 is formed on the surface insulating film 83. Then, a photoresist (not shown) patterned correspondingly to the pad opening 90 is formed on the insulating film 89. This photoresist is employed as a mask for etching the insulating film 89, thereby forming the pad opening 90 passing through the insulating film 89.

Then, the photoresist is removed by ashing, and photoresist (not shown) patterned correspondingly to the surface portion 88 is formed on the insulating film 89. This photoresist is employed as a mask for forming an aluminum film filling up the pad opening 90 on the region of the insulating film 89 including the photoresist to cover the embedded portion 87. Then, the photoresist is dissolved and removed, so that an unnecessary part (other than the surface portion 88) of the aluminum film is lifted off along with the photoresist. Thus, the surface portion 88 is so formed as to form the bonding pad 52 including the embedded portion 87 and the surface.

An aluminum-copper alloy may be employed as the material of the surface portion 88 in place of aluminum in the above-mentioned modification.

While the residual dielectric film portions (62, 68, 74 and 80) each are generally rectangularly formed in plan view in the above-mentioned second embodiment, the residual dielectric film portions (62, 68, 74 and 80) may alternatively be circularly or triangularly formed in plan view, for example.

While the metal wires (61, 67, 73 and 79) each are made of copper in the above-mentioned second embodiment, the metal wires (61, 67, 73 and 79) each may alternatively be made of another metal.

While the metal wires (61, 67, 73 and 79) each are formed by the so-called dual damascene process in the above-mentioned second embodiment, the metal wires (61, 67, 73 and 79) may alternatively be formed by the so-called single damascene process.

While the illustrative embodiments of the present invention are described in detail, these are mere specific examples for clarifying the technical contents of the present invention and it is not to be construed limitative thereto. The spirit and the scope of the invention are only limited by the claims appended hereto.

This Application corresponds to Japanese Patent Application No. 2006-302982 filed with the Japanese Patent Office on Nov. 8, 2006, and Japanese Patent Application No. 2006-306998 filed with the Japanese Patent Office on Nov. 13, 2006, the full disclosures of which are incorporated herein by reference.

What is claimed is:

1. A semiconductor device comprising:
    a semiconductor substrate;
    a first insulating layer having a first wire-forming region and laminated on the semiconductor substrate;
    a first metal wiring pattern embedded in the first wire-forming region;
    a second insulating layer having a second wire-forming region and laminated on the first insulating layer;
    a second metal wiring pattern embedded in the second wire-forming region;
    a non-wire-forming region distinct from the second wire-forming region;
    a wire-opposed region distinct from the first wire-forming region and opposing the second wire-forming region;
    a non-wire-opposed region distinct from the first wire-forming region and opposing the non-wire-forming region; and
    first dummy metal patterns embedded both in the wire-opposed region and in the non-wire-opposed region,
    wherein the first dummy metal patterns are electrically connected with neither the first metal wiring pattern nor the second metal wiring pattern.

2. The semiconductor device according to claim 1, further comprising:
    a second dummy metal pattern embedded in the second non-wire-forming region; and
    a via connecting the first dummy metal pattern embedded in the non-wire-opposed region to the second dummy metal pattern.

3. The semiconductor device according to claim 2, wherein the first dummy metal patterns and the second dummy metal pattern are each arranged in a staggered manner.

4. The semiconductor device according to claim 1, further comprising a second dummy metal pattern embedded in the second non-wire-forming region, wherein the first dummy metal patterns and the second dummy metal pattern are each arranged in a staggered manner.

* * * * *